Figure 1:
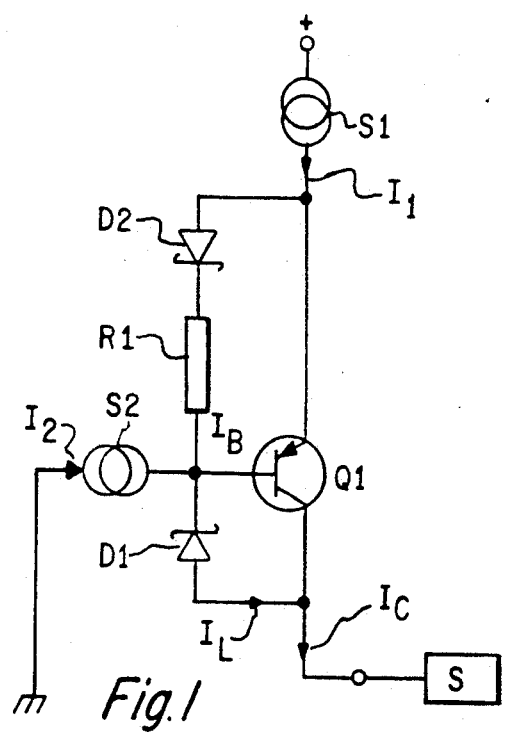

United States Patent

Bucksch et al.

Patent Number: 5,278,461
Date of Patent: Jan. 11, 1994

[54] INTEGRATED TRANSISTOR CIRCUIT

[75] Inventors: Walter Bucksch, Freising; Anton Vorel, Eggenfelden, both of Fed. Rep. of Germany

[73] Assignee: Texas Instruments Incorporated, Dallas, Tex.

[21] Appl. No.: 6,579

[22] Filed: Jan. 21, 1993

[30] Foreign Application Priority Data

Jan. 24, 1992 [DE] Fed. Rep. of Germany ....... 4201947

[51] Int. Cl.$^5$ .............................................. G05F 3/20
[52] U.S. Cl. ................... 307/317.2; 307/458; 307/253; 307/254; 307/300; 307/317.1
[58] Field of Search ............. 307/317.2, 458, 253, 307/254, 255, 300, 362, 317.1

[56] References Cited

U.S. PATENT DOCUMENTS

| | | | |
|---|---|---|---|
| 4,249,091 | 2/1981 | Yamagiwa | 307/317.2 |
| 4,704,544 | 11/1987 | Horwitz | 307/254 |
| 4,745,304 | 5/1988 | Wilson | 307/317.2 |
| 4,754,158 | 6/1988 | Halberstein | 307/317.2 |
| 4,847,515 | 7/1989 | Nakach et al. | 307/255 |
| 5,013,999 | 5/1991 | Yamada | 307/317.2 |
| 5,159,211 | 10/1992 | Fujii | 307/362 |

FOREIGN PATENT DOCUMENTS 2166772 1/1976 Fed. Rep. of Germany.
2928452C2 4/1990 Fed. Rep. of Germany.

OTHER PUBLICATIONS

U. Tietze, Ch. Schenk, Halbleiter-Schaltungstechnik, pp. 468–501.

Primary Examiner—John S. Heyman
Assistant Examiner—My-Trang Ton
Attorney, Agent, or Firm—Ira S. Matsil; William E. Hiller; Richard L. Donaldson

[57] ABSTRACT

The invention relates to an integrated transistor circuit comprising a transistor (Q1) of which the collector is connected to an input of a circuit (S) and between the base and collector of which an antisaturation diode (D1) is connected. According to the invention a further current branch is provided between the base and the emitter and includes a series circuit of a diode (D2) and a resistor (R1). As a result, a leakage current flowing in reverse direction into the antisaturation diode (D1) flows via the diode (D2) and the resistor (R1) and not via the emitter-base path of the transistor (Q1) and consequently amplification of the leakage current is prevented.

20 Claims, 1 Drawing Sheet

INTEGRATED TRANSISTOR CIRCUIT

The present invention relates to an integrated transistor circuit comprising a transistor of which the collector is connected to an input of a circuit to be driven and between the base and collector of which an antisaturation diode is connected.

In integrated circuits comprising lateral pnp transistors with antisaturation Schottky diodes between base and collector undesirable leakage currents occur at the Schottky junctions. In particular at high temperatures, the leakage currents flowing through the Schottky junctions, in the case of the junctions operated in the reverse direction, increase to such an extent that electronic circuits controlled by the transistor circuits can no longer be controlled in the desired manner.

Antisaturation Schottky diodes operated in the reverse direction have at a temperature of about 150° C. a leakage current flowing in the reverse direction of about 1 $\mu$A when a reverse voltage of about 5 V is applied. This leakage current necessarily flows as base current $I_B$ via the base-emitter path of the associated transistor and accordingly generates an undesired collector current $I_C$ which is equal to the base current of the transistor operated in emitter circuit multiplied by the gain factor $h_{fe}$. With a gain factor $h_{fe}$ of about 10 the collector current flowing in the reverse direction is about 12 $\mu$A. This collector current alone can lead to driving of the circuit controlled by the transistor circuit although no base drive signal has been applied to the transistor circuit.

To avoid the effects of the undesired leakage currents transistors in integrated circuits have been surrounded with (n+) or (p+) guard rings. In spite of these measures, with conventional integrated transistor circuits it has not been possible to prevent adequately substrate effects occurring due to leakage currents. One disadvantageous consequence of these substrate effects resides in that an inverse operation of such an integrated transistor circuit is not possible. Further disadvantages of conventional integrated transistor circuits are to be seen in that the provision of the guard rings means an excessive demand on the silicon area, of which only little is available in any case; consequently, the geometry of integrated circuits resulting from guard rings is not desirable in modern circuits with high package density.

The problem underlying the present invention is therefore to provide an integrated transistor circuit which has considerably reduced leakage currents at elevated operating temperature. This problem is solved in an integrated circuit of the type outlined at the beginning with the features set forth in the characterizing clause of claim 1.

The integrated transistor circuit according to the invention is distinguished by a further current branch which consists of a series circuit of a diode and a resistor and which connects the base of the transistor to the emitter of the transistor. As a result, the leakage current occurring does not flow via the base-emitter diode but via the current path including the diode and the resistor. The circuit according to the invention has the advantage over conventional integrated circuits that the leakage current flows from the emitter via the resistor and the diode to the base and consequently there is no amplification of the leakage current by the gain factor of the transistor. Integrated transistor circuits according to the invention are particularly suitable for use with an extended operating temperature range.

Advantageous further developments of the invention are set forth in the subsidiary claims. The integrated transistor circuit characterized in claim 7 makes operation thereof possible in both current directions.

Figure 2:
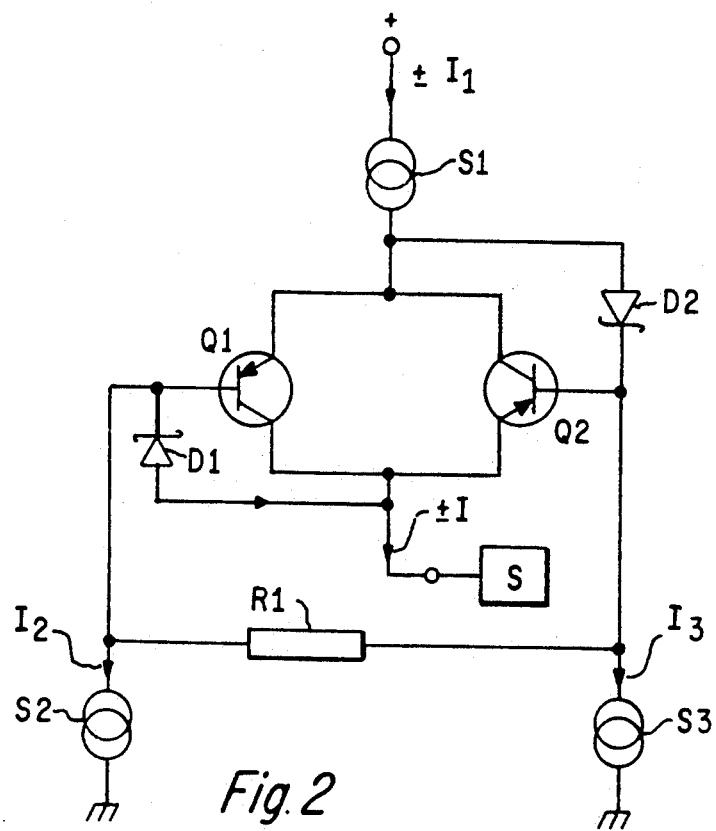

Examples of embodiment of the invention will be explained hereinafter with the aid of the drawings, wherein:

FIG. 1 shows a first embodiment of the integrated transistor circuit according to the invention, FIG. 2 shows an example of the application of the principle illustrated with the aid of FIG. 1.

The transistor circuit shown in FIG. 1 includes a transistor Q1 having an emitter, a collector and a base, an antisaturation Schottky diode D1 between the base and the collector and a series circuit consisting of a resistor R1 and a diode D2 between the base and the emitter. The base of the transistor Q1 is connected on the one hand via the Schottky diode D1 to the collector and on the other hand via the resistor R1 and the diode D2 to the emitter. The collector of the transistor Q1 is further connected to an input of a circuit S which is not shown in detail and which is to be driven by means of the collector current. The emitter of the transistor Q1 is connected to a constant current source S1 furnishing the current $I_1$. The base drive is also provided via a constant current source furnishing the current $I_2$.

As already mentioned, the transistor Q1 is fed by the current $I_1$ furnished by the second current source S1 and driven by means of the second current source S2. When a current $I_2$ flows via the current source S2 a base current $I_B$ will flow and open the transistor Q1. The circuit S is then driven via the conductive transistor Q1 in that the collector current $I_C$ is supplied to the circuit S. When no base current flows, the transistor Q1 becomes nonconductive and consequently no collector current $I_C$ then flows. However, at relatively high temperatures a leakage current $I_L$ flows through the Schottky diode D1 and acts for the transistor like a base current. Without adopting special measures, this base current would lead to a collector current $I_C$ which would flow through the emitter-collector path of the transistor Q1 and would be equal to the base current $I_B$ multiplied by the gain factor $h_{fe}$ of the transistor. Depending on the magnitude of the gain factor and the magnitude of the temperature, the collector current $I_C$ could increase to such an extent that the circuit S would be driven although the current source S2 is disconnected, i.e. there is no intentional base driving of the transistor Q1.

To avoid this effect occurring at higher temperatures the leakage current can flow via the shunt path formed by the Schottky diode D2 and the resistor R1 to the base-emitter diode of the transistor Q1 and consequently is no longer subjected to the amplification by the transistor Q1. Since the forward voltage of the Schottky diode is less than the forward voltage of the base-emitter diode of the transistor, the shunt path will become conductive on a temperature rise earlier than the emitter-base path of the transistor. Consequently, even at higher temperatures no increase of the collector current $I_C$ of the transistor Q1 due to the leakage current $I_L$ will occur, such an increase possibly leading to an undesirable driving of the circuit S.

To ensure that the transistor circuit described functions in optimum manner, the Schottky diode D2 must be dimensioned so that its forward voltage is smaller than the emitter-base voltage of the transistor Q1. At the same time, an optimum functioning of the transistor circuit requires that the resistor be sc dimensioned that at high temperatures (150° C.) and with the transistor Q1 nonconductive it exhibits only a minor effect, i.e. the leakage current can flow unrestricted via the diode D2 and the resistor R1. At low temperatures (−40° C.) with the transistor Q1 conductive the resistor R1 should on the other hand be high enough for only a high-resistance connection to exist between the emitter and base. If the resistor R1 is dimensioned as described above, the current flowing therethrough will be substantially smaller than the base current when the transistor Q1 is conductive and substantially equal to the leakage current of the diode D1 when the transistor Q1 is nonconductive.

In the fabrication of the integrated transistor circuit according to the invention the resistor R1 may either be integrated in a separate well or accommodated in one well together with the Schottky diode D2, the transistor Q1 and the Schottky diode D1. A particularly advantageous and compact arrangement of the integrated transistor circuit is obtained if the resistor R1 is formed as part of the Schottky diode D2 which together with the transistor Q1 and the Schottky diode D1 is integrated in a well.

An advantageous application of the principle implemented in the circuit of FIG. 1 in a bidirectional switch is shown in FIG. 2. The circuit of FIG. 2 differs from the circuit of FIG. 1 only in that it includes a second transistor Q2 connected antiparallel to the transistor Q1. The collector and the emitter of the second transistor Q2 are connected to an emitter and a collector of the transistor Q1. The base of the second transistor Q2 is connected to the terminal of the diode D2 connected to the resistor R1 and to a further current source S3. The diode D2 is at the same time the antisaturation Schottky diode of the transistor Q2. By means of this embodiment of the transistor circuit both a positive current and a negative current can be switched through to the circuit to be driven, depending on the current furnished by the current source S1.

If the current source S1 furnishes a positive current $I_1$, the transistor Q1 opens and a current $I_2$ flows via the base into the current source S2. The base current is substantially equal to the current $I_2$ furnished by the current source S2. The circuit S to be driven is supplied with a positive current I via the collector of the transistor Q1, said current being approximately equal to the current $I_1 - I_2 - I_3$. The current sources S2 and 83 are so dimensioned that for example at a current $I_1$ of about 300 μA they furnish a current of only about 50 μA.

In this state of the circuit the transistor Q2 is nonconductive and comes into use only when a negative current at the current source S1 is to be switched through to the circuit $ to be driven. However, at elevated temperatures a leakage current flows via the antisaturation Schottky diode D2 of the transistor Q2 and also acts as base current for said transistor. The base current of the transistor Q2 flowing due to said leakage current can be led off via the Schottky diode D1 and the resistor R1 so that it need not flow via the emitter-collector path of the transistor Q2; it is accordingly also not amplified by the gain factor $h_{fe}$ of said transistor. Thus, a temperature increase does not result in any appreciable change of the current flowing to the circuit $ when the transistors Q1 and Q2 are nonconductive.

If the transistor Q1 is rendered nonconductive by disconnecting the current source S2 no current should then flow to the circuit S. However, at higher temperatures leakage currents flow through the transistors D1 and D2 and in each case act like base currents for the transistors Q1 and Q2 respectively. The series circuit of the diode D2 and the resistor R1 on the one hand and the series circuit of the diode D1 and the resistor R1 on the other hand act however like shunt paths between the emitter and the base of the transistor Q1 and between the emitter and the base of the transistor Q2 respectively so that the particular current generated by the base current in the lead to the circuit 8 does not have to flow via the emitter-collector path of the respective transistor and is thus not subjected to the current amplification. The quiescent current in the drive line of the circuit S flowing due to the leakage currents thus remains at a negligibly small value.

The second embodiment of the circuit described illustrated in FIG. 2 can also be operated with reversed current directions, as already mentioned. The above description of the mode of operation then also applies but in the switch-through condition it is not the transistor Q1 which is conductive but the transistor Q2.

A particular advantage of the circuit illustrated in FIG. 2 is that two additional diodes are not required and only one resistor is needed for diverting the leakage current. For the leakage current is diverted in each case via the antisaturation diode of the nonconductive transistor and via the resistor R1.

We claim:

1. An integrated transistor circuit comprising:
   a bipolar transistor including an emitter, a base and a collector;
   an antisaturation diode connected between the base and collector of said bipolar transistor; and
   a series circuit coupled between the base and emitter of said bipolar transistor, said series circuit comprising a diode and a resistor.

2. Integrated transistor circuit according to claim 1, characterized in that the resistor is so dimensioned that through said resistor a current which is negligibly small compared with the base current flows when the transistor is conductive and a current substantially equal to the leakage current of the antisaturation diode flows when the transistor is nonconductive.

3. Integrated transistor circuit according to claim 1, characterized in that the diode is a Schottky diode and has a lower forward voltage than the emitter-base voltage of the transistor.

4. Integrated transistor circuit according to claim 1, characterized in that the transistor is a lateral pnp Schottky transistor.

5. Integrated transistor circuit according to claim 1, characterized in that the resistor is integrated as part of the diode in the well of the transistor and of the antisaturation diode.

6. Integrated transistor circuit according to claim 1, characterized in that the emitter and collector of the transistor are connected to the collector and emitter of a second transistor respectively and that the base of the second transistor is coupled between said diode and resistor of said series circuit.

7. Integrated transistor circuit according to claim 6, characterized in that the transistor is a lateral pnp Schottky transistor.

8. Integrated transistor circuit according to claim 1 characterized in that the collector of the transistor is coupled to an input of a circuit to be driven.

9. A transistor circuit comprising:
   a pnp bipolar transistor having an emitter, a base and a collector;
   an antisaturation diode coupled between said collector and said base;
   a diode including an anode and a cathode, said anode of said diode coupled to said emitter; and
   a resistor including first and second terminals, said first terminal of said resistor coupled to said cathode of said diode and said second terminal of said resistor coupled to said base.

10. The circuit of claim 9 wherein the resistor is dimensioned such that a current which is negligibly small compared with the base current flows through said resistor when said transistor is conductive and a current substantially equal to the leakage current of the antisaturation diode flows through said resistor when the transistor in nonconductive.

11. The circuit of claim 9 wherein said diode comprises a Schottky diode and has a lower forward voltage than the emitter-base voltage of the transistor.

12. The circuit of claim 9 and further comprising second bipolar transistor having an emitter, collector and a base wherein the emitter of said second transistor is coupled to the collector of said pnp bipolar transistor and the collector of the second transistor is coupled to the emitter of said pnp bipolar transistor and the base of the second transistor is coupled to the cathode of said diode.

13. A transistor circuit comprising:
   a bipolar transistor having an emitter, a base and a collector;
   an antisaturation diode coupled between said collector and said base;
   a diode including first and second terminals, said first terminal of said diode coupled to said emitter; and
   a resistor including first and second terminals, said first terminal of said resistor coupled to said second terminal of said diode and said second terminal of said resistor coupled to said base, said resistor having a resistance such that when the transistor is conductive, a current which is negligibly small compared with a base current will flow through said resistor and when the transistor is non-conductive, a current which is substantially equal to a leakage current of said antisaturation diode will flow through said resistor.

14. The circuit of claim 13 wherein said bipolar transistor comprises an pnp transistor.

15. The circuit of claim 13 wherein said diode comprises a Schottky diode with a forward voltage which is less than a emitter base voltage of said transistor.

16. The circuit of claim 13 and further comprising a second bipolar transistor having an emitter, collector and a base wherein the emitter of said second transistor is coupled to the collector of the bipolar transistor and the collector of the second transistor is coupled to the emitter of the bipolar transistor and the base of the second transistor is coupled to the first terminal of the resistor and the second terminal of the diode.

17. A transistor circuit comprising:
   a bipolar transistor having an emitter, a base and a collector, said transistor characterized by an emitter-base voltage;
   an antisaturation diode coupled between said collector and said base;
   a Schottky diode including first and second terminals, said first terminal of said diode coupled to said emitter, said Schottky diode having a forward voltage which is less than said emitter-base voltage; and
   a resistor including first and second terminals, said first terminal of said resistor coupled to said second terminal of said diode and said second terminal of said resistor coupled to said base.

18. The circuit of claim 17 and further comprising a second bipolar transistor having an emitter, collector and a base wherein the emitter of said second transistor is coupled to the collector of said bipolar transistor and the collector of the second transistor is coupled to the emitter of said bipolar transistor and the base of the second transistor is coupled to the first terminal of the resistor and the second terminal of the diode.

19. The circuit of claim 18 wherein said bipolar transistor and said second bipolar transistor each comprise pnp bipolar transistors.

20. The circuit of claim 19 wherein the resistor is dimensioned such that a current which is negligibly small compared with the base current flows through said resistor when said bipolar transistor is conductive and a current substantially equal to the leakage current of the antisaturation diode flows through said resistor when said bipolar transistor is nonconductive.

* * * * *